(12) United States Patent
Miller

(10) Patent No.: US 6,737,225 B2
(45) Date of Patent: May 18, 2004

(54) METHOD OF UNDERCUTTING MICRO-MECHANICAL DEVICE WITH SUPER-CRITICAL CARBON DIOXIDE

(75) Inventor: Seth Andrian Miller, Sasche, TX (US)

(73) Assignee: Texas Instruments Incorporated, Dallas, TX (US)

( * ) Notice: Subject to any disclaimer, the term of this patent is extended or adjusted under 35 U.S.C. 154(b) by 102 days.

(21) Appl. No.: 10/034,647

(22) Filed: Dec. 28, 2001

(65) Prior Publication Data

US 2003/0124462 A1 Jul. 3, 2003

(51) Int. Cl.⁷ .................................................. G03F 7/42
(52) U.S. Cl. ....................................... 430/329; 430/311
(58) Field of Search ................................. 430/311, 329, 430/331

(56) References Cited

U.S. PATENT DOCUMENTS

| | | | |
|---|---|---|---|
| 4,441,791 A | 4/1984 | Hornbeck | 350/360 |
| 4,566,935 A | 1/1986 | Hornbeck | 156/626 |
| 4,662,746 A | 5/1987 | Hornbeck | 350/269 |
| 4,956,619 A | 9/1990 | Hornbeck | 330/4.3 |
| 5,312,882 A | 5/1994 | DeSimone et al. | 526/501 |
| 5,382,623 A | 1/1995 | DeSimone et al. | 524/557 |
| 5,451,633 A | 9/1995 | DeSimone et al. | 524/731 |
| 5,496,901 A | 3/1996 | DeSimone | 526/89 |
| 5,505,807 A | 4/1996 | Min et al. | 156/230 |
| 5,506,317 A | 4/1996 | DeSimone et al. | 526/201 |
| 5,514,759 A | 5/1996 | DeSimone et al. | 526/89 |
| 5,527,865 A | 6/1996 | DeSimone et al. | 526/89 |
| 5,530,077 A | 6/1996 | DeSimone et al. | 526/89 |
| 5,561,216 A | 10/1996 | Barborak et al. | 528/392 |
| 5,583,688 A | 12/1996 | Hornbeck | 359/291 |
| 5,589,105 A | 12/1996 | DeSimone et al. | 252/351 |
| 5,618,894 A | 4/1997 | DeSimone et al. | 526/89 |
| 5,639,836 A | 6/1997 | DeSimone et al. | 526/201 |
| 5,672,667 A | 9/1997 | DeSimone et al. | 526/89 |
| 5,674,957 A | 10/1997 | DeSimone et al. | 526/89 |
| 5,679,737 A | 10/1997 | DeSimone et al. | 524/529 |
| 5,688,879 A | 11/1997 | DeSimone | 526/89 |
| 5,739,223 A | 4/1998 | DeSimone | 526/89 |
| 5,766,367 A | 6/1998 | Smith et al. | 134/2 |
| 5,780,553 A | 7/1998 | DeSimone et al. | 525/276 |
| 5,783,082 A | 7/1998 | DeSimone et al. | 210/634 |
| 5,824,726 A | 10/1998 | DeSimone et al. | 524/429 |
| 5,840,820 A | 11/1998 | DeSimone et al. | 526/169 |
| 5,855,819 A | 1/1999 | DeSimone et al. | 252/511 |
| 5,860,467 A | 1/1999 | DeSimone et al. | 164/5 |
| 5,863,612 A | 1/1999 | DeSimone | 427/422 |
| 5,866,005 A | 2/1999 | DeSimone et al. | 210/634 |
| 5,872,157 A | 2/1999 | DeSimone et al. | 522/5 |
| 5,922,833 A | 7/1999 | DeSimone | 528/490 |
| 5,939,501 A | 8/1999 | DeSimone et al. | 526/89 |
| 5,939,502 A | 8/1999 | DeSimone et al. | 526/89 |
| 5,944,996 A | 8/1999 | DeSimone et al. | 210/634 |
| 5,945,477 A | 8/1999 | DeSimone et al. | 524/601 |
| 5,977,292 A | 11/1999 | DeSimone et al. | 528/279 |
| 5,981,673 A | 11/1999 | DeSimone et al. | 526/89 |
| 6,001,418 A | 12/1999 | DeSimone et al. | 427/240 |
| 6,010,542 A | 1/2000 | DeYoung et al. | 8/474 |
| 6,024,801 A | 2/2000 | Wallace et al. | 134/1 |
| 6,025,459 A | 2/2000 | DeSimone et al. | 528/312 |
| 6,083,565 A | 7/2000 | Carbonell et al. | 427/430.1 |
| 6,107,443 A | 8/2000 | DeSimone et al. | 528/272 |
| 6,127,000 A | 10/2000 | Carbonell et al. | 427/393.6 |
| 6,147,790 A | 11/2000 | Meier et al. | 359/291 |
| 6,176,895 B1 | 1/2001 | DeSimone et al. | 75/723 |
| 6,211,422 B1 | 4/2001 | DeSimone et al. | 585/16 |
| 6,224,774 B1 | 5/2001 | DeSimone et al. | 210/634 |
| 6,240,936 B1 | 6/2001 | DeSimone et al. | 134/33 |
| 6,242,165 B1 | 6/2001 | Vaartstra | 430/329 |
| 6,248,136 B1 | 6/2001 | McClain et al. | 8/142 |
| 6,277,753 B1 | 8/2001 | Mullee et al. | 438/692 |
| 6,288,202 B1 | 9/2001 | DeSimone et al. | 528/196 |
| 6,298,902 B1 | 10/2001 | DeSimone et al. | 164/131 |
| 6,306,564 B1 | 10/2001 | Mullee | 430/329 |
| 6,500,605 B1 * | 12/2002 | Mullee | 430/329 |

OTHER PUBLICATIONS

Supercritical Carbon–dioxide Cleaning Technology Review, http://www.pprc.org/pprc/p2tech/co2/co2intro.html (Jul. 1996).

Technical Issue and CO2–based Cleaning Systems, http://www.pprc.org/pprc/p2tech/co2/co2tech.html (Jul. 1996).

McClain et al, Design of Nonionic Surfactants for Supercritical Carbon Dioxide, Science, vol. 274 (Dec. 1996).

Biberger et al, Photoresist and Photoresist Resiue Removal with Supercritical Co2—A Novel Approach to Cleaning Wafers, Semiconductor Fabtech, 12th Edition (Jul. 2000).

Jafri et al., Critical Point Drying and Cleaning for MEMS Technology, Part of the SPIE Conference on MEMS Reliability for Critcal and Space Applications, SPIE vol. 3880 (Sep. 1999).

* cited by examiner

*Primary Examiner*—Kathleen Duda
(74) *Attorney, Agent, or Firm*—Charles A. Brill; Wade James Brady, III; Frederick J. Telecky, Jr.

(57) ABSTRACT

A method for removing sacrificial layers during the process of fabricating micro-mechanical devices with a solution of super-critical carbon dioxide. A mixture of super-critical carbon dioxide with other solvents, co-solvents and surfactants is used during the process to remove sacrificial layers. The disclosed method has many advantages over the prior art, including a reduction of capillary forces that can damage the free-standing micro-mechanical superstructures, an absence of plasma induced damage caused by ashing operations, and a reduction in the use of environmentally sensitive chemicals. Another advantage of the disclosed process is that the swelling of the photoresist layers is minimized. The disclosed method may be used to remove sacrificial layers that were deposited during the process of fabricating micro-mechanical devices. The method is also effective to remove a protective recoat layer that is deposited over a micro-mechanical device after it has been fabricated.

37 Claims, 6 Drawing Sheets

METHOD OF UNDERCUTTING MICRO-MECHANICAL DEVICE WITH SUPER-CRITICAL CARBON DIOXIDE

FIELD OF THE INVENTION

This invention relates to the field of micro-mechanical devices, more specifically to the methods used to remove sacrificial layers from a micro-mechanical device, and to methods used to remove sacrificial layers with a solution comprising super-critical carbon dioxide.

BACKGROUND OF THE INVENTION

Micro-mechanical devices or micro-electromechanical systems (MEMS) are micron-scale devices, often with moving parts, and are fabricated using traditional semiconductor processes such as optical lithography, doping, metal sputtering, oxide deposition, and plasma etching, which have been developed for the fabrication of integrated circuits.

Micromirrors, such as the DMD™ micromirror array from Texas Instruments, are a type of micro-mechanical device. Other types of micro-mechanical devices include accelerometers, pressure and flow sensors, gears and motors. Many of these devices have found wide commercial success. A novel way to fabricate micro-mechanical devices is to deposit metal layers on top of a sacrificial layer that is comprised of a solvent/resin solution such as photoresist. After the metal layers have been patterned and etched, then the sacrificial layers are removed, thus uncovering a free-standing micro-mechanical device. This process is particularly useful for the fabrication of micromirror arrays, but may also be used in the fabrication of other micro-mechanical structures.

One problem encountered during the manufacturing of micro-mechanical devices occurs when sacrificial layers are removed from the substrate to reveal a free-standing micro-mechanical device (i.e. a superstructure). Because micro-mechanical devices are very fragile, they can be easily damaged by particles, excessive heat, or even the capillary action of cleansing solvents. To avoid the problems associated with the capillary action of solvents, a plasma ash operation has been used to remove the sacrificial layers that surround devices. The plasma ash step, however, has several important drawbacks. Specifically, the plasma ash step can create a great deal of heat, which can deform or otherwise damage micro-mechanical devices. In addition, the heat can adversely affect any underlying electrical devices, which have a specific thermal budget. The plasma ash step is also problematic because it can result in the deposition/implantation of the plasma materials or other sputtered materials in the micro-mechanical devices, such as fluorine. Furthermore, plasma ash operations require the use of environmentally sensitive chemicals, such as carbon tetrafloride ($CF_4$).

Another important problem encountered during the manufacturing of micro-mechanical devices is the low yield of the fabrication processes. The processes for fabricating micro-mechanical devices are very expensive. The back-end dicing and packaging process can be particularly costly processes. Under current manufacturing practices, most micro-mechanical devices cannot be tested until they have been fully diced and packaged. This is because the sacrificial layers that surround each device must remain in place to protect the device from the particulate contamination generated by the back-end processes. Thus, if it were possible to identify non-functional devices at an intermediate step and recoat the functional devices before the costly back-end steps are performed, then the cost per functional device could be greatly decreased. It is therefore advantageous to test the micro-mechanical devices after they have been fabricated, but before the expensive back-end process steps are performed. This intermediate testing is difficult to perform for micro-mechanical devices because once the sacrificial layers have been removed, they are very susceptible to contamination and damage. In addition, the processes of applying and removing a protective recoat layer can damage to the micro-mechanical devices.

Yet another problem associated with the removal of sacrificial layers is that many cleansing solvents cause the sacrificial layers to swell while they are removed. This swelling occurs as the sacrificial layers begin to absorb the cleansing solvents during the removal process. The swelling of the sacrificial layers can damage the micro-mechanical devices by bending or otherwise deforming them.

There is therefore a need in the art for a method for effectively removing sacrificial layers that surround a micro-mechanical device without causing the damage to the devices. Specifically, a method is needed that will not produce the capillary forces associated with most aqueous solvents or the damage that results from plasma ash operations. There is also a need in the art for a method for effectively removing a protective recoat layer that has been applied to a free-standing micro-mechanical device after the sacrificial layers have been removed. There is also a need in the art for a method for removing sacrificial or protective recoat layers from a micro-mechanical device while minimizing any swelling that may occur in these layers during the removal process.

BRIEF SUMMARY OF THE INVENTION

The present invention provides an improved method for removing sacrificial layers during the process of fabricating a micro-mechanical device. The disclosed method is also suitable to remove a protective recoat layer that has been applied to a fabricated micro-mechanical device after fabrication has been complete. The method utilizes super-critical carbon dioxide as a cleansing agent for the sacrificial or protective recoat layers. Super-critical carbon dioxide has advantages over prior art cleansing methods because it has relatively low surface tension, thereby eliminating capillary forces from the removal process. Super-critical carbon dioxide is also advantageous because it does not cause any of the plasma-induced damage associated with ashing operations. Furthermore, the super-critical carbon dioxide process requires fewer environmentally sensitive chemicals than other processes.

According to one aspect of the invention, the method for cleaning sacrificial layers comprises the steps of depositing a first sacrificial layer on a substrate; curing the first sacrificial layer; removing portions of the first sacrificial layer to define a set of first via forms; depositing a first metal layer on the first sacrificial layer; removing portions of the first metal layer to define a set of first via supports; depositing a second sacrificial layer on the first metal layer; curing the second sacrificial layer; removing portions of the second sacrificial layer to define a set of second via forms; depositing a second metal layer on the second sacrificial layer; removing portions of the second metal layer to define a set of second via supports; removing the first and second sacrificial layers with a solution comprising super-critical carbon dioxide, and a solvent and/or surfactant.

In another aspect of the invention, the method for cleaning a protective recoat layer comprises the steps of depositing a first sacrificial layer on a substrate; curing the first sacrificial layer; removing portions of the first sacrificial layer to define a set of first via forms; depositing a first metal layer on the first sacrificial layer; removing portions of the first metal layer to define a set of first via supports; depositing a second sacrificial layer on the first metal layer; curing the second sacrificial layer; removing portions of the second sacrificial layer to define a set of second via forms; depositing a second metal layer on the second sacrificial layer; removing portions of the second metal layer to define a set of second via supports; recoating the micro-mechanical device with a recoat layer of sufficient thickness to completely encapsulate the micro-mechanical device; curing the recoat layer; removing the recoat layer with a solution comprising super-critical carbon dioxide and a cosolvent and/or surfactant, as described above.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

A new process has been developed for removing sacrificial layers surrounding a micro-mechanical device with super-critical carbon dioxide. The new process is also suitable for removing a protective recoat layer from a micro-mechanical device wherein the protective layer was applied to the device after the sacrificial layers had been removed. This process is designed to be used with all kinds of micro-mechanical devices, such as accelerometers, pressure and flow sensors, gears and motors. The process is advantageous because the solution utilized has negligible surface tension forces, thereby reducing the capillary forces acting on the micro-mechanical device structures. The process is also advantageous because a solution of super-critical carbon dioxide, surfactants and cosolvents can be custom tailored to reduce any swelling of the sacrificial layers that may occur as the layers are dissolved. The process has a further advantage in that it requires fewer environmentally sensitive chemicals.

Super-Critical Carbon Dioxide Cleaning

Cleaning with carbon dioxide is advantageous from an environmental standpoint because $CO_2$ is non-flammable, virtually inert, and is not an ozone-depleting compound. After cleaning, the only waste stream generated are the contaminants that were removed from the part that was cleaned. There are no large, liquid streams to treat (as there is with aqueous cleaning) or air streams to treat (as is the case with some solvent cleaning solutions).

Super-critical fluids are by definition at a temperature and pressure greater than or equal to the critical temperature and pressure of the fluid. Carbon Dioxide's critical pressure is about 1,070 pounds per square inch (psi) and critical temperature is about 31 degrees C., so super-critical applications using $CO_2$ typically operate at temperatures between 32 degrees C. and 49 degrees C. and pressures between 1,070 and 3,500 psi.

Figure 1:
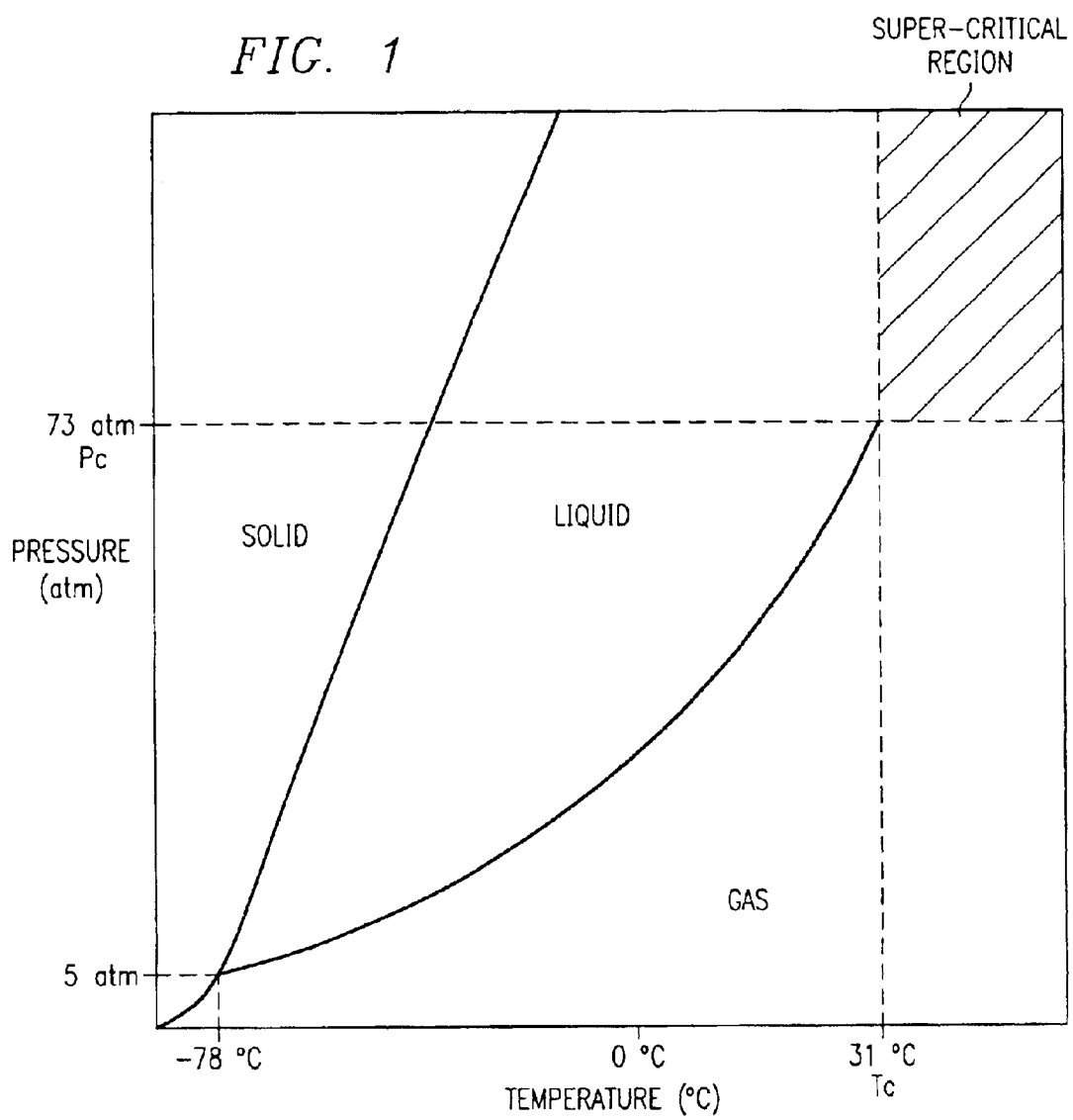
FIG. 1 depicts a pressure-temperature (P-T) phase diagram for carbon dioxide.

A pressure-temperature (P-T) phase diagram for carbon dioxide is depicted in FIG. 1. FIG. 1 demonstrates that the critical pressure for carbon dioxide is approximately 73 atmospheres and the critical temperature is 31° C. At pressures and temperatures above this point, the carbon dioxide is in what is known as the super-critical region. A super-critical fluid actually has physical properties somewhere between those of a liquid and a gas. Super-critical fluids are able to spread out along a surface more easily than a true liquid because they have lower surface tensions than most liquids. At the same time, a super-critical fluid maintains a liquid's ability to dissolve substances that are soluble in the compound, which a gas cannot do. In the case of super-critical carbon dioxide, a wide variety of contaminants can thus be removed from a surface even if the surface has an intricate geometry or includes cracks and crevices.

Figure 2:
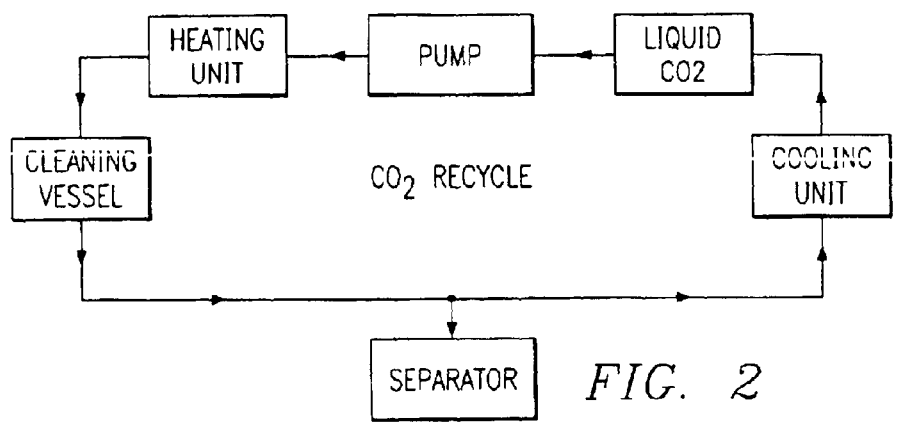
FIG. 2 is a block diagram depicting the components of a representative super-critical cleaning system.

The basic components that comprise a super-critical cleaning system are depicted in FIG. 2. Carbon dioxide ($CO_2$), which may be stored as a gas or in liquid form, is compressed above its critical pressure by a pump. The compressed $CO_2$ is then heated above its critical temperature in a heater, or sometimes in the cleaning chamber, making it super-critical. Any parts in the cleaning chamber are cleaned by exposure to the super-critical carbon dioxide. The cleaning chamber may include an impeller to promote mixing.

A solution containing dissolved contaminants are then bled off to a separator vessel, where the super-critical carbon dioxide is decompressed and returned to a gaseous state. The contaminants remain in liquid form and are collected from the bottom of the separator, while the gaseous $CO_2$ is sent through a chiller to return it to a liquid form for storage to be reused again. This closed-loop recycling of the $CO_2$ means only a small portion of the cleaning solution has to be replaced over time due to system leakage. The cleansed parts can be removed from the chamber and are immediately ready for the next step in the manufacturing process, since no drying or rinsing is required to remove residual cleaning solution.

For the purpose of illustration, but not for the purpose of limitation, the following description will describe the operations of this cleansing process during the fabrication of a micromirror array.

Description of Micromirror Devices

Figure 3:
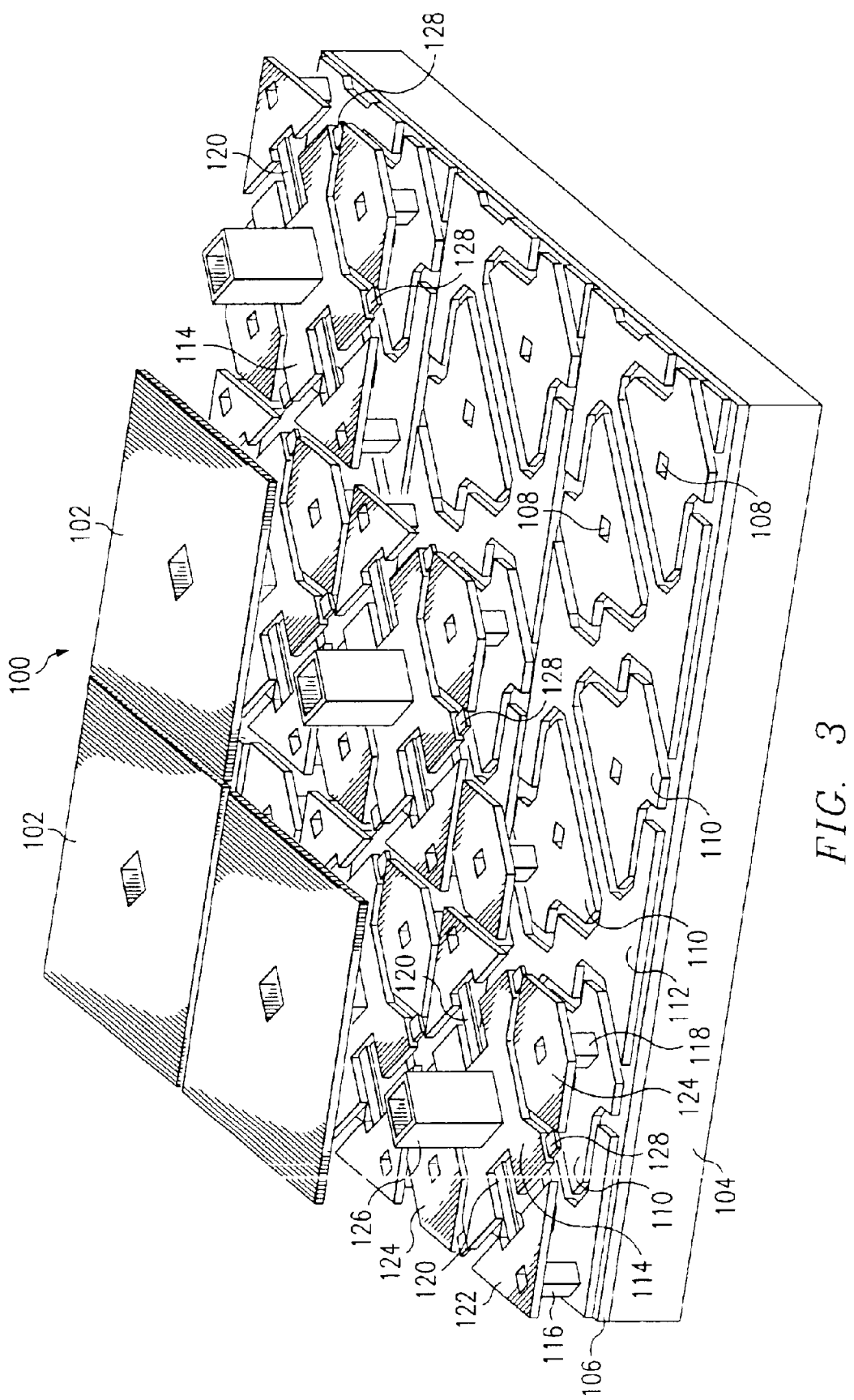
FIG. 3 is a perspective view of a small portion of a micromirror array according to one aspect of the present invention.
Figure 4:
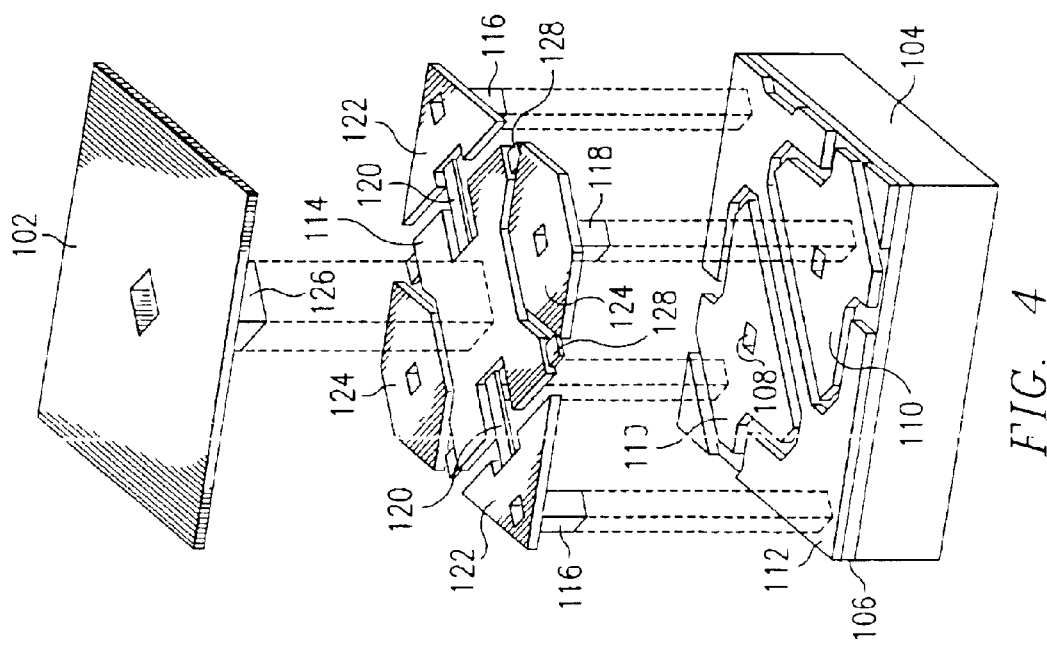
FIG. 4 is an exploded perspective view of a single micromirror element from the micromirror array of FIG. 1.

A perspective view of a typical hidden-hinge micromirror array 100 is depicted in FIG. 3. This array often includes more than a thousand rows and columns of micromirrors. FIG. 3 shows a small portion of a micromirror array with several mirrors 102 removed to show the underlying mechanical structure of the micromirror array. FIG. 4 is an exploded view of a single micromirror element further detailing the relationships between the micromirror structures.

A micromirror is fabricated on a semiconductor, typically silicon, substrate 104. Electrical control circuitry is typically fabricated in or on the surface of the semiconductor substrate 104 using standard integrated circuit process flows. This circuitry typically includes, but is not limited to, a memory cell associated with, and typically underlying, each mirror 102 and digital logic circuits to control the transfer of the digital image data to the underlying memory cells. Voltage driver circuits to drive bias and reset signals to the mirror superstructure may also be fabricated on the micromirror substrate, or may be external to the micromirror. Image processing and formatting logic is also formed in the substrate 104 of some designs. For the purposes of this disclosure, addressing circuitry is considered to include any circuitry, including direct voltage connections and shared memory cells used to control the direction of rotation of a micromirror. The silicon substrate 104 and any necessary metal interconnection layers are isolated from the micromirror superstructure by an insulating layer 106 which is typically a deposited silicon dioxide layer on which the micromirror superstructure is formed. Holes, or vias, are opened in the oxide layer to allow electrical connection of the micromirror superstructure with the electronic circuitry formed in the substrate 104.

Address electrodes 110 and a mirror bias connection 112 are formed from a metal layer deposited on the insulating layer 106. Some micromirror designs have separate and distinct landing electrodes which are electrically connected to the mirror bias connection 112. Landing electrodes limit the rotation of the mirror 102 and prevent the rotated mirror 102 or hinge yoke 114 from touching the address electrodes 110, which have a voltage potential relative to the mirror 102. If the mirror 102 contacts the address electrodes 110, the resulting short circuit could fuse the torsion hinges 120 or weld the mirror 102 to the address electrodes 110, in either case ruining the micromirror. Since the same voltage is always applied both to the landing electrodes and the mirrors 102, the mirror bias connection and the landing electrodes are combined in a single structure when possible. The landing electrodes are combined with the mirror bias connection 112 by including regions on the mirror bias/reset connection 112, called landing sites, which mechanically limit the rotation of the mirror 102 by contacting either the mirror 102 or the torsion hinge yoke 114. These landing sites are often coated with a material chosen to reduce the tendency of the mirror 102 and torsion hinge yoke 114 to stick to the landing site.

Hinge support spacervias 116 and upper address electrode spacervias 118, typically extend approximately 1 $\mu$m above the address electrodes 110 and mirror bias connections 112. A hinge cap 122 and upper address electrodes 124 are supported by the hinge support spacervias 116 and upper address electrode spacervias 118. The hinge cap 122 anchors the ends of torsion hinges 120. A hinge yoke 114 is formed between and supported by the torsion hinges 120. The hinge yoke 114 is allowed to rotate by twisting the thin torsion hinges 120. A mirror support spacervia 126 is formed on the hinge yoke, and supports a mirror 102 approximately 2 $\mu$m above the hinge yoke 114.

Electrostatic attraction between an address electrode 110 and a deflectable rigid member, which in effect form the two plates of an air gap capacitor, is used to rotate the mirror structure. Depending on the design of the micromirror device, the deflectable rigid member is the torsion beam yoke 114, the beam or mirror 102, a beam attached directly to the torsion hinges, or a combination thereof. The upper address electrodes 124 also electrostatically attract the deflectable rigid member.

The force created by the voltage potential is a function of the reciprocal of the distance between the two plates. As the rigid member rotates due to the electrostatic torque, the torsion beam hinges resist deformation with a restoring torque that is an approximately linear function of the angular deflection of the torsion beams. The structure rotates until the restoring torsion beam torque equals the electrostatic torque or until the rotation is mechanically blocked by contact between the rotating structure and a fixed component. Most micromirror devices are operated in a digital mode wherein sufficiently large bias voltages are used to ensure full deflection of the micromirror superstructure.

When operated digitally, each micromirror is fully deflected in either of the two directions about the torsion beam axis. Digital operation uses a relatively large voltage to ensure the mirror is fully deflected. Since it is advantageous to drive the address electrode using standard logic voltage levels, a bias voltage, typically a negative voltage, is applied to the mirror metal layer to increase the voltage difference between the address electrodes and the mirrors. Use of a sufficiently large mirror bias voltage—a voltage above what is termed the collapse voltage of the device—ensures the mirror will deflect to the closest landing electrodes even in the absence of an address voltage. Therefore, by using a large mirror bias voltage, the address voltages need only be large enough to deflect the mirror slightly.

Figure 5:
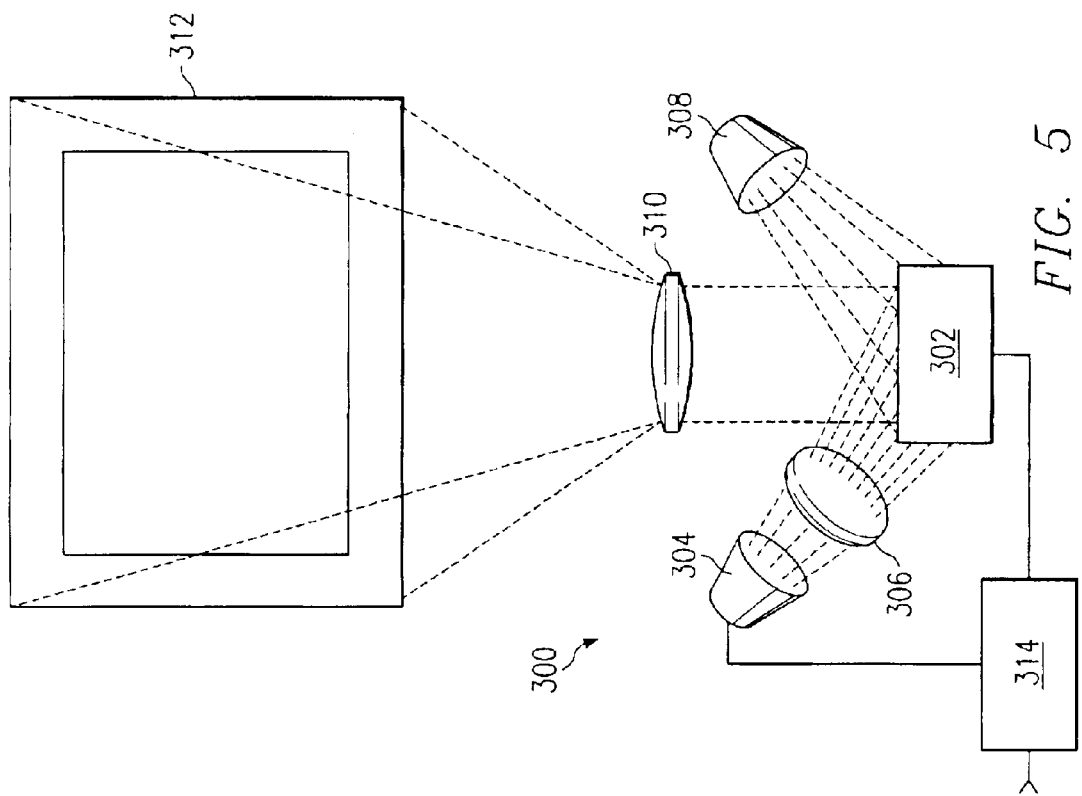
FIG. 5 is a schematic view of a micromirror-based projection system utilizing a micromirror array according to one aspect of the present invention.

FIG. 5 is a schematic view of an image projection system 300 using an improved micromirror 302 according to the present invention. In FIG. 5, light from light source 304 is focused on the improved micromirror 302 by lens 306. Although shown as a single lens, lens 306 is typically a group of lenses and mirrors which together focus and direct light from the light source 304 onto the surface of the micromirror device 302. Image data and control signals from controller 314 cause some mirrors to rotate to an on position and others to rotate to an off position. Mirrors on the micromirror device that are rotated to an off position reflect light to a light trap 308 while mirrors rotated to an on position reflect light to projection lens 310, which is shown as a single lens for simplicity. Projection lens 310 focuses the light modulated by the micromirror device 302 onto an image plane or screen 312.

Fabrication of the Micromirror Devices

Figure 6:
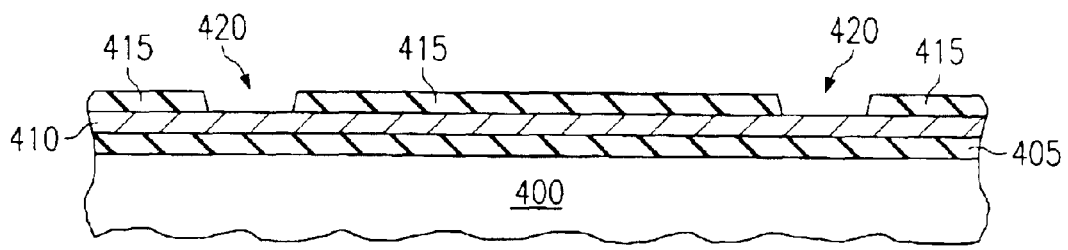
FIG. 6 is a cross-section view along a torsion hinge axis of a partially fabricated micromirror device after a via has been etched in the dielectric layer.

The steps for fabricating a micro-mirror device are depicted in FIGS. 6–15. In FIG. 6 a substrate 400 is depicted. As stated above, various electronic devices for controlling the micromirror device may be embedded within or atop the substrate 400. None of these devices, however, are depicted in FIG. 6. First, an insulating layer 405 is deposited on top of the substrate 400 to form a protective layer between the micromirror devices and the substrate. Preferably, this insulating layer 405 is silicon dioxide, which may be either grown or deposited. Next, a metal layer 410 is deposited on top of the insulating layer 405. This layer 410, also known as metal three (M3), is patterned to form address electrodes 110 and a mirror bias connection 112. The address electrodes 110 are electrically connected to the underlying electronic circuitry through the vias 108 (not shown in FIG. 6). A dielectric layer 415 is then deposited on top of the metal three layer 410. The dielectric layer 415 is then patterned and etched to form holes 420, which permit electrical connections to the micromirror superstructure from the metal three layer 410.

Figure 7:
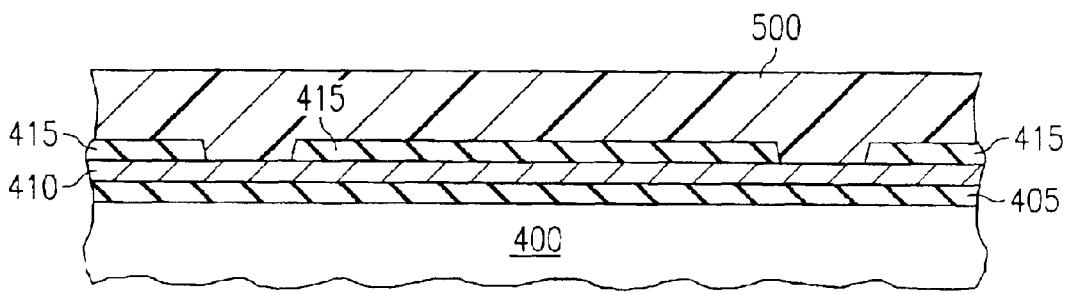
FIG. 7 is a cross-section view along a torsion hinge axis of a partially fabricated micromirror device after a first sacrificial layer has been deposited on the substrate.
Figure 8:
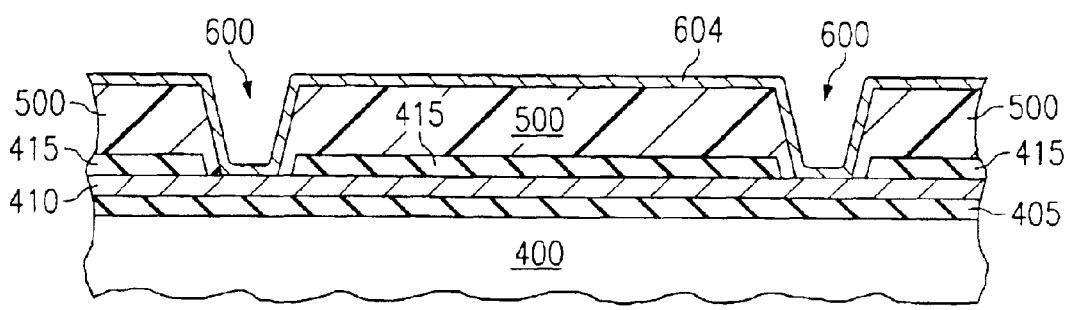
FIG. 8 is a cross-section view along a torsion hinge axis of a partially fabricated micromirror device after a torsion hinge metal layer has been deposited on the first sacrificial layer.

After the holes 420 are formed in the dielectric layer 415 the surface of the entire wafer is coated with a first sacrificial layer 500. The deposition of this first sacrificial layer 500 is depicted in FIG. 7. The first sacrificial layer is typically one micron (1 $\mu$m) thick and may be comprised of a positive photoresist layer, which is spun onto the substrate surface 400. The thickness of the first sacrificial layer 500 can be adjusted to accommodate various device and process restrictions. The first sacrificial layer 500 may then be patterned to form vias 600 in the sacrificial layer, as depicted in FIG. 8. The vias 600 will act as forms for the torsion hinge support spacer vias 116. After these vias 600 are formed, the sacrificial layer will be cured. This cure process typically involves a deep UV hardening step, which will prevent bubbling and deformation of the subsequent layers during later processing steps. After this, another metal layer 604 is deposited on top of the first sacrificial layer 500. This metal layer 604 will form the torsion hinge metal and is sputtered over the first sacrificial layer 500 and into the spacer vias 600. Metal layer 604 is used to make electrical contact with the metal three layer 410. The metal layer 604 is typically 600 angstroms thick and comprises an aluminum alloy. The metal layer 604 is also known as a torsion hinge metal layer.

Figure 9:
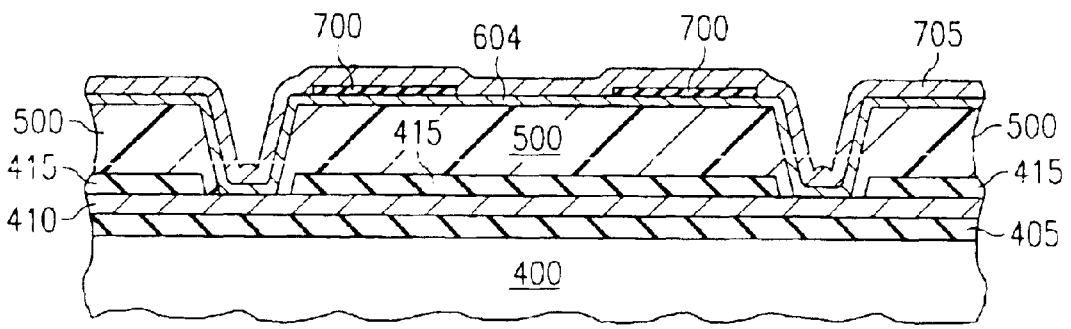
FIG. 9 is a cross-section view along a torsion hinge axis of a partially fabricated micromirror device after a torsion hinge metal 2 layer has been deposited on the substrate.

After the torsion hinge metal layer 604 has been deposited, another oxide layer is deposited, patterned and etched to form the oxide torsion hinge etch stops 700. These steps are depicted in FIG. 9. After the oxide torsion hinge etch stops 700 are complete, a second layer of metal 705 is deposited on the substrate 400. This second metal layer 705 is typically 4000 angstroms thick and is comprised of an aluminum alloy. After this, the metal layers 604 and 705 are etched in a single step to form the torsion hinge support posts 116, the torsion hinges 120, and the yokes 114, as depicted in FIG. 10.

Figure 10:
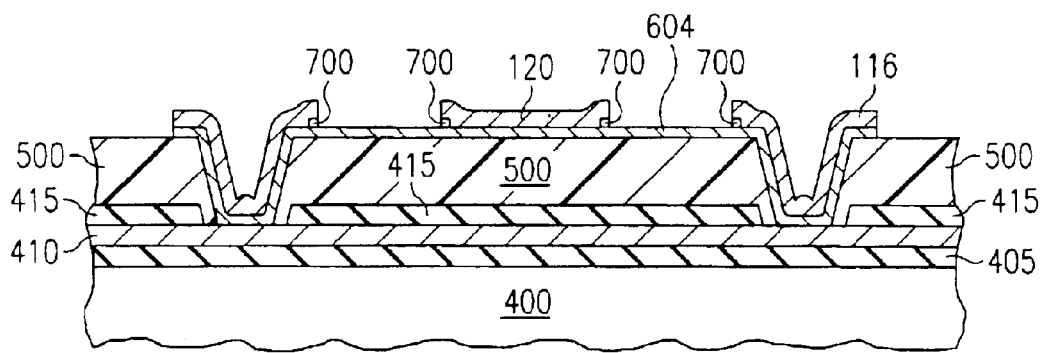
FIG. 10 is a cross-section view along a torsion hinge axis of a partially fabricated micromirror device after hinge support posts and torsion hinges have been patterned and defined in the hinge metal layers.
Figure 11:
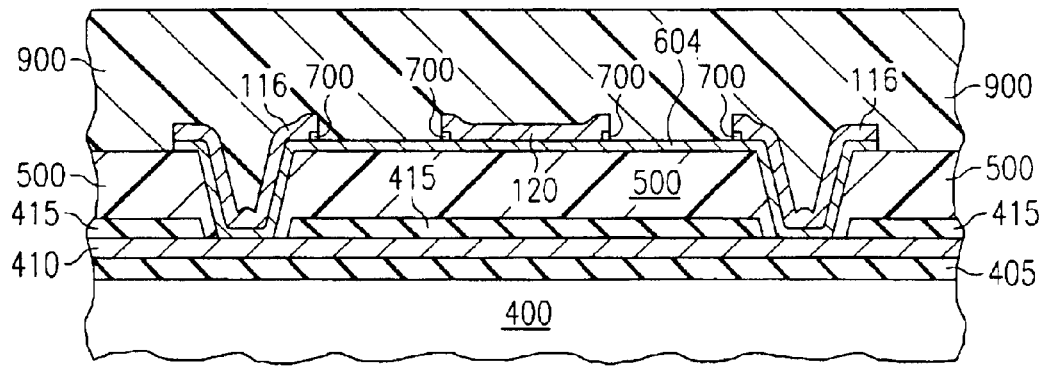
FIG. 11 is a cross-section view along a torsion hinge axis of a partially fabricated micromirror device after a second sacrificial layer has been deposited on the substrate.

In FIG. 10, a cross section of the torsion hinge support posts 116 and the torsion hinge 120 is depicted. After these structures have been fabricated, a second sacrificial layer 900 is deposited as depicted in FIG. 11. The properties of the sacrificial layer 900 must be selected such that they can readily flow into the cracks and crevices of the torsion hinge support posts 116 and around the torsion hinges 120. Care must also be taken when depositing the second sacrificial layer 900 to create a planar upper surface. This is because the upper surface of the second sacrificial layer 900 is where a metallized mirror layer will be deposited. The second sacrificial layer 900 will typically be about 1.3 microns ($\mu$m) thick and will be comprised of positive photoresist.

Figure 12:
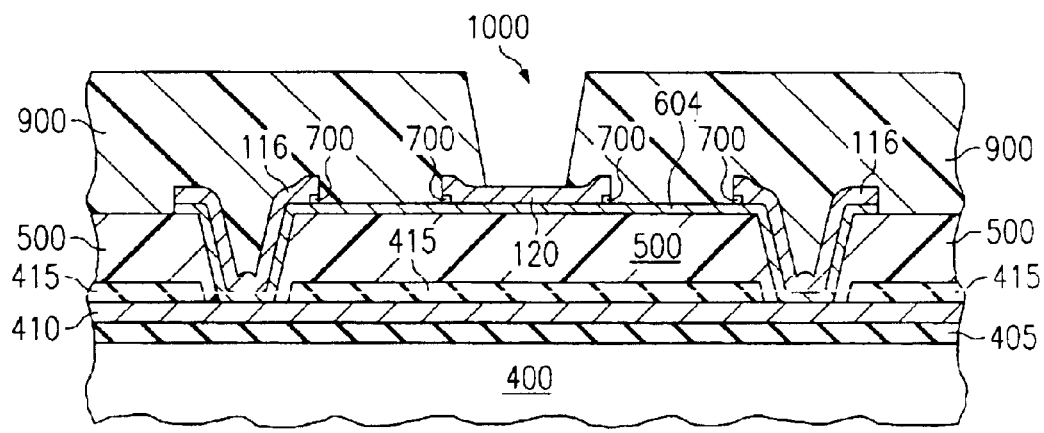
FIG. 12 is a cross-section view along a torsion hinge axis of a partially fabricated micromirror device after mirror support spacervias have been patterned and defined in the second sacrificial layer.

The next step is to pattern and etch a mirror support spacer via 1000 in the second sacrificial layer 900. This step is depicted in FIG. 12. In FIG. 12, the height of the mirror support spacer via 1000 is controlled by the thickness of the second sacrificial layer 900. Lowering the micromirror brings it closer to the torsion hinge axis 120 and therefore reduces the moment of inertia during the deflection of the micromirror. A lower moment of inertia leads to shorter switching time between digital deflection states, which is desirable in achieving the greatest number of gray levels. A shorter mirror support spacer via 1000 also provides less opportunity for light to get under the mirrors when they are tilted. Light that does get under the mirrors is scattered by the micromirror superstructure. Some of the light scattered by the micromirror superstructure eventually passes between the mirrors and enters the aperture of the projection lens, and reaches the image plane where it lowers the contrast ratio of the display system. A shorter mirror support spacer via 1000 also reduces the torque experienced by the mirror support spacer via 1000. Additionally, for a given hole width, the use of a thinner second sacrificial layer 900 increases the metal step coverage on the sides of the spacer via hole 1000. Because of the improved step coverage and reduced torque, the mirror support spacer via 1000 can have a smaller width. A narrow mirror support spacer via 1000 reduces the size of the hole in the mirror, thereby increasing the optically active mirror area and reducing the amount of light scattered by the hole in the mirror. As a result, both the efficiency and the contrast ratio of the display system may be increased.

Figure 13:
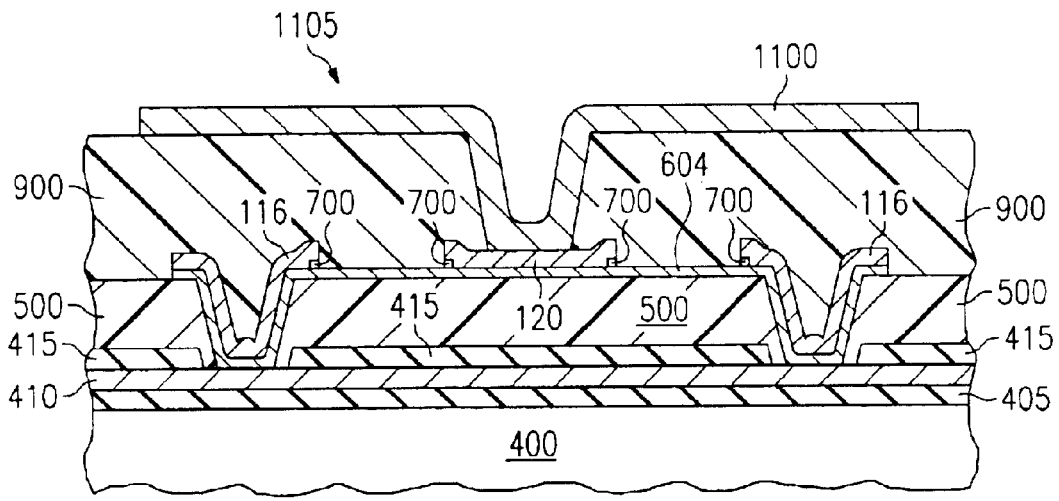
FIG. 13 is a cross-section view along a torsion hinge axis of a partially fabricated micromirror device after the mirror metal layer has been deposited, patterned and defined.
Figure 14:
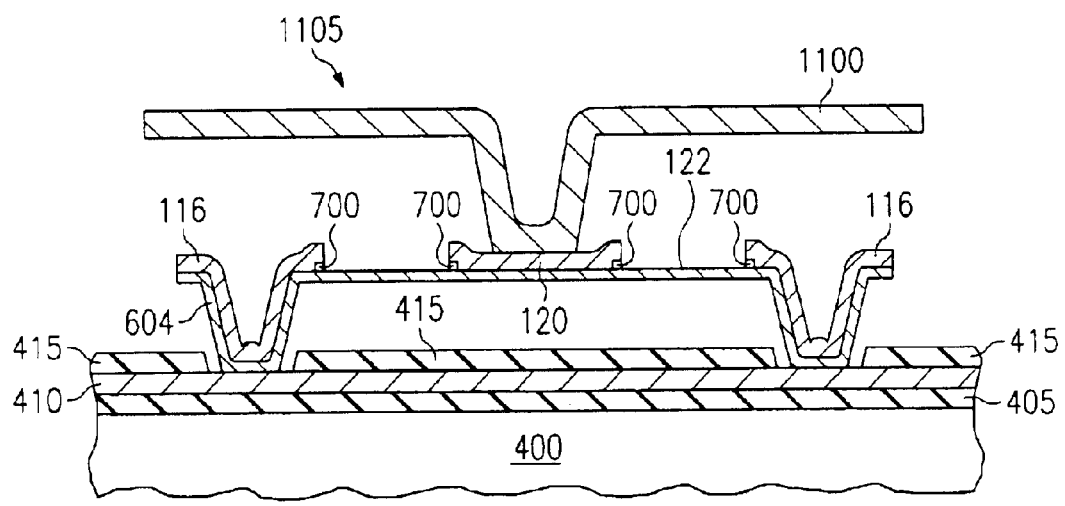
FIG. 14 is a cross-section view along a torsion hinge axis of a fully fabricated micromirror device after the two sacrificial layers have been removed by the cleansing step.
Figure 15:
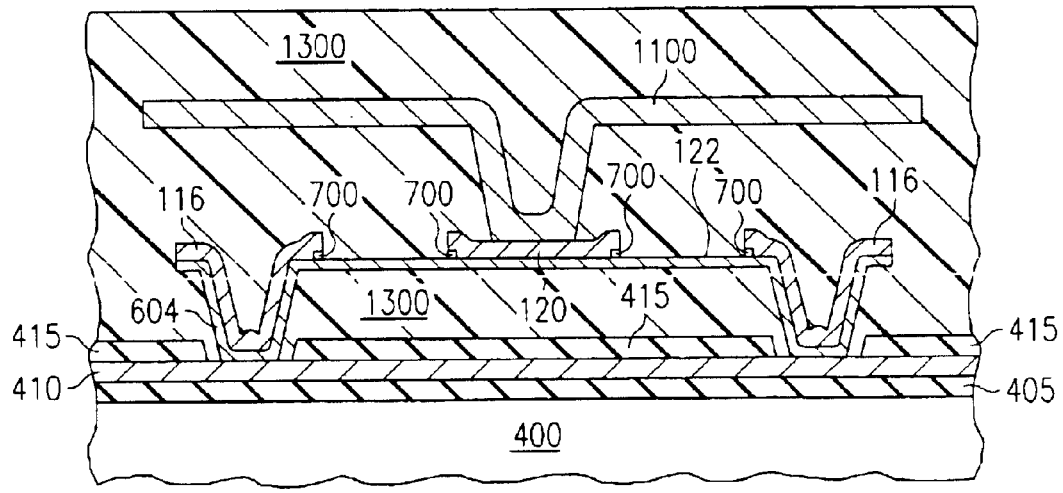
FIG. 15 is a cross-section view along a torsion hinge axis of a fully fabricated micromirror device after the entire device has been recoated with a protective layer.

After the second sacrificial layer has been deposited, patterned and etched, it is typically cured through a process such as heating and/or deep UV hardening. After this, a mirror metal layer 1100 is deposited and patterned to form the mirrors. This step is depicted in FIG. 13. The mirror metal layer 1100 is typically a 3000 angstrom thick layer of aluminum alloy. Once the mirror metal layer 1100 is patterned, the first and second sacrificial layers are etched away, thereby exposing a complete micromirror superstructure 1105. This is depicted in FIG. 14. After the sacrificial layers 500 & 900 have been removed, the superstructure 1105 can deflect about the axis of the torsion hinge 120. In FIG. 14, it can be seen that the torsion hinge 120 is no longer supported by the first sacrificial layer and the mirror metal layer 1100 is no longer supported by the second sacrificial layer. The process by which these sacrificial layers are cleared from the superstructure is described in further detail below.

After the mirror metal layer 1100 has been deposited, patterned and etched, the structural components of the micro-mechanical superstructure 1105 are complete. As depicted in FIG. 13, the components of the micro-mechanical superstructure 1105 include the torsion hinge metal layer 604, the hinge support posts 116, the torsion hinges 120, and the mirror metal layer 1100. It can also be seen that the first sacrificial layer 500 and the second sacrificial layer 900 encase large portions of the micro-mechanical superstructure 1105. The process of removing these sacrificial layers 500 & 900 must therefore be carefully controlled to prevent damage to the superstructure 1105.

Removal of the Sacrificial Layers with Super-Critical Carbon Dioxide

In order to remove these layers without causing damage to the superstructure 1105, the entire device is immersed in a solution of super-critical carbon dioxide. Ideally, the resin system in the sacrificial layers and the solvent system in the cleansing solutions are matched so that the sacrificial layers swell minimally during the super-critical $CO_2$ strip phase. This can be accomplished by optimizing either the resin side or the solvent side. For novolak photoresists, for example, variables to consider include the molecular weight of the resin, the type and amount of photoactive compound (PAC), the amount of residual solvent contained in the material after curing, and the amount of cross-linking of the polymer. If possible, it is preferred to start with uncrosslinked, low molecular weight polymers with larger amounts of trapped solvent. This gives the best potential to minimize swelling during the removal process. On the $CO_2$/cosolvent/surfactant side, the goal again is to minimize swelling. Swelling can occur as the first step in the layer removal process. As solvent molecules penetrate the sacrificial layer, its volume grows to accommodate them. At some point, the individual polymer strands free themselves from the bulk, and float away in the solvent. To minimize the swelling of the sacrificial layer, it is preferred to use a mixture of an ineffective co-solvent (in which the sacrificial layer is not soluble), with solvent or surfactant that is effective on the sacrificial layer. For many cases, $CO_2$ is not particularly effective as a solvent for the sacrificial layer. Super-critical $CO_2$ is, however, an effective co-solvent for other solvents or surfactants that will dissolve the sacrificial layer. Thus, depending upon the specific material utilized in the sacrificial layer, an appropriate mixture of solvents, cosolvents and surfactants will be utilized.

Super-critical carbon dioxide is advantageous as a co-solvent solution because it has minimal surface tension effects. Accordingly, the micro-mechanical superstructure 1105 will not be damaged by capillary forces as the sacrificial layers 500 & 900 are removed. In order to reduce the swelling effects of the sacrificial layers 500 & 900 while they are being removed, an appropriate combination of solvents, co-solvents and surfactants is added to the super-critical carbon dioxide solution. Mixtures that have been proven to be effective at reducing swelling include a mixture of super-critical carbon dioxide with a variety of solvent compounds from the alcohol group of chemicals (such as methanol and ethanol), the esters group of chemicals (such as ethyl acetate and methyl acetate), the ketone group of chemicals (such as acetone and methylethylketone) and the ether group of chemicals (such as methyl tertiary-butyl ether). Surfactant compounds can be ionic or non-ionic, and are chosen to enhance the solubility of the sacrificial layer in the specific $CO_2$/solvent mixture. A description of non-ionic surfactants that are suitable for use with the invention is found in J. B. McClain et al., *Design of Nonionic Surfactants for Supercritical Carbon Dioxide*, 274 Science 2049 (1996), which is incorporated into this specification by reference. Of particular note is polystyrene-b-poly(1,1-dihydroperfluorooctyl acrylate)polymer, which is a non-ionic surfactant that is suitable for use in a cleansing process with super-critical carbon dioxide. Other surfactants may also be suitable for use with this invention, particularly when used with other co-solvents.

After the sacrificial layers 500 & 900 are removed, the micro-mechanical superstructure 1105 is fully functional and may be tested to ensure that its performance is within the required specifications. As stated in the Background of the Invention, it is advantageous to determine if the micro-mechanical devices are functional at an intermediate stage in the fabrication process so that the costly dicing and packaging steps are not wasted on non-functional devices. Several techniques can be used to test the micro-mechanical devices, including applying test probes to each individual device or each array. A map describing the functional devices will be generated by the test device after testing is complete. This map will identify the devices that are non-functional and therefore should not be packaged during the back-end steps.

Recoating the Micro-mechanical Superstructure with a Protective Recoat Layer

To ensure that the micro-mechanical devices are protected during the back-end processing steps (dicing and packaging) the devices may be recoated with a protective layer 1300 that covers the entire substrate. It is important to select a recoat solution that will be effective for recoating the micro-mechanical superstructure 1105 without damaging it. The following factors should be considered in selecting an appropriate recoat solution:

1. The solid loading of the recoat solution should be as high as possible.
2. The viscosity of the solution should be as low as possible.
3. The surface tension of the solution should be minimized and the device surface wetting maximized.
4. The solution should rapidly dissolve trapped gasses, and not allow gasses to bubble out either during the coating process or during baking.
5. The coating should be uniform across the surface of the substrate.

Although it is impossible to optimize all of these factors in a single solution, compromises can be made based upon the architecture of the micro-mechanical device or other process parameters.

The solid content of the recoat solution should be high in order to prevent capillary forces from acting on the micro-mechanical superstructure 1105 as the solvent in the recoat solution evaporates. The higher the resin filler content of the recoat solution, the less the capillary forces generated by the solvent will damage the micro-mechanical superstructure 1105. If there is a high resin content, then the spaces under the mirror metal layer 1100 and under the torsion hinge metal layer 604 are reinforced by the resin filler and the evaporating solvent is unable to pull the metal layers into the underlying spaces. Since the resin filler content is related to the viscosity of the coating material, however, the resin filler content cannot be raised arbitrarily with rendering the coating material too viscous to flow under the metal layers 1100 & 604.

Once the proper coating material is selected, the coating material is typically deposited on the wafer by expelling the coating material from a syringe and then spinning the wafer. For purposes of illustration and not limitation, the wafer may be spun at 1500 RPM for 120 seconds. After the coating material is deposited, the material is cured. Various curing methods can be used to evaporate the solvent from the coating material. One method involves the gradual heating of the wafer to evaporate the solvent. The rate of solvent evaporation is controlled by adjusting the temperature of the wafer. For example, the solvent could be evaporated gradually until the risk of deformation is passed, and then the rate of evaporation increased. Alternatively, a large excess quantity of solvent is rapidly evaporated and the wafer then cooled to limit the rate of evaporation during a critical phase of the cure when the solvent is most likely to deform the mirrors.

While spinning, material is flung off the side of the wafer by centrifugal force, and the solids and solvent are dispersed evenly across the wafer. Solvent begins to evaporate from the solution, and the height of the recoat solution begins to drop. If the height of the recoat solution drops near to that of the device structure, capillary forces will begin to tug on the underside of the superstructure 1105. However, if the resulting coating is thick enough to completely encapsulate the superstructure, the capillary forces will tug nearly equally from all sides of the structure. These opposing forces cancel, and the net force on the device is nearly zero, allowing it to remain unharmed as the solvent evaporates. By contrast, if the resulting coating is the less than or nearly equal to the height of the device, the capillary forces will tend to pull downwards. These forces will bend the device, reversibly or irreversibly, and can interlock adjacent structures of the device in a landed or collapsed position even if the bending is reversible. As such, as long as there is no undissolved material or bubbles in the solution, and the solution coats the device evenly, a wide variety of choices of solids is acceptable. In one embodiment, the recoat solution is a commercially available photoresist, and the solid may be a resin, such as one from the novolac resin group. The photoresist need not be photoactive to serve as an effective recoat layer 1300. This is because the protective recoat layer is not being used to pattern and etch any patterns on the wafer. Instead, it is being used to protect the micro-mechanical superstructures from damage or particles during subsequent processing.

Most solutions that are thick enough to fully coat the device during spinning are too viscous to penetrate the pores and crevices of the superstructure. The strategy of increasing the solids loading of the solution to increase the coating thickness will result in a more viscous liquid, which, if it is able to penetrate the pores of the structure, will do so too slowly to be of value in a manufacturing environment. In one embodiment, a photoresist with a solids loading of 40% or better is used. At less than 40% loading, significant bending of the mirror or hinge may occur. This bending is irreversible for most micro-mechanical superstructures. It may be possible to use thinner resins for devices that bend reversibly, and only need to be protected from directly landing and stiction.

A photoresist recoat layer may be applied with a syringe, pipette, or automatic dispenser. The wafer can be spinning slowly or stationary. After dispense, the solution will slowly flow over the device, and a wait period is prescribed that is specific to the resist used. The procedure tends to trap bubbles under the devices and the bubbles must be dissipated before the spin process starts. Generally, resists with viscosities less than 120 centistokes are able to penetrate the pores of a micromirror array in two minutes or less.

Three other factors that can influence the rate at which the recoat solution covers the superstructure are the solution's surface tension, the wetting of the structures, and the ability of the solution to dissolve gasses. Some resists, for instance, flow down in between the mirrors, while others are wicked underneath them.

Gasses are often trapped underneath the micromirrors. Any bubbles left in the device can cause damage during the spin process, or lead to cracking as the gases expand and escape from the spun wafer during the bake process. Great care should be taken to assure that no bubbles or other particles are present before spinning. Some recoat solutions are more efficient at dissipating these trapped gasses than others.

After the micro-mechanical superstructure 1105 has been covered with a protective recoat layer, the substrate/wafer may receive traditional back-end processes such as dicing and packaging. If intermediate testing has been performed on the device, then the non-functional devices may be discarded prior to these steps. By discarding non-functional devices at an intermediate step, the cost per functional device can be greatly lowered.

After all of the back-end processing steps have been complete, the protective recoat layer 1300 may be removed. The removal of this protective layer 1300 raises many of the same problems (swelling, capillary action, etc.) that are associated with the removal of the sacrificial layers 500 & 900. Thus, it is contemplated that the super-critical carbon dioxide solution for removing the sacrificial layers 500 & 900 may also be used to remove the protective recoat layer 1300. This specific process parameters of this step may differ from the earlier cleansing step. This is because the third sacrificial layer 1300 is usually thicker than the combination of the first and second sacrificial layers 500 & 900 and because the material used for the protective recoat layer may be different.

For the protective recoat process, a low-molecular weight resin without any photoactive compounds is preferred. In one aspect of the invention, the recoat material will be cured with a soft-bake, rather than hard-bake, to avoid removing too much of the solvent from the recoat layer. A soft bake process will also prevent the resin from forming too many cross-links (i.e. polymerization), which can limit the range of solvents effective to remove the recoat layer. As a result, a mixture of super-critical carbon dioxide and methanol will be effective to remove the recoat layer without damaging the micro-mechanical devices. Other solvents, such as those described previously, may also be effective. After the protective layer 1300 has been removed, the packaging of the device(s) may be completed so that the product is ready for commercial use.

In sum, although there has been disclosed to this point a particular embodiment for cleaning layers from a micro-mechanical superstructure, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims. In the following claims, only elements denoted by the words "means for" are intended to be interpreted as means plus function claims under 35 U.S.C. § 112, paragraph six.

What is claimed is:

1. An improved method of fabricating a micro-mechanical device, the method comprising:
   depositing at least one sacrificial layer on a substrate;
   curing the sacrificial layer;
   fabricating a micro-mechanical device on the sacrificial layer; and
   removing the sacrificial layer by immersing the substrate in a cleansing solution comprising super-critical carbon dioxide and a solvent suitable to remove the sacrificial layer.

2. A method according to claim 1, wherein the solvent is selected from the group consisting of methanol, ethanol, ethyl acetate, methyl acetate, acetone, methylethylketone, and methyl tertiary-butyl ether.

3. A method according to claim 1, wherein the sacrificial layer comprises a photoresist solution.

4. A method according to claim 3, wherein the photoresist solution comprises a mixture of novolac resin and a photoresist solvent.

5. A method according to claim 1, wherein the step of curing the sacrificial layer comprises a hard bake.

6. A method according to claim 1, wherein the step of curing the sacrificial layer comprises a soft bake.

7. A method according to claim 1, wherein the step of curing the sacrificial layer comprises UV hardening.

8. A method according to claim 1, wherein the step of removing the sacrificial layer further comprises agitating the cleansing solution with an impeller.

9. A method according to claim 1, wherein the cleansing solution further comprises a non-ionic surfactant solution.

10. A method according to claim 9, wherein the non-ionic surfactant solution comprises a polystyrene-b-poly(1,1-dihydroperfluorooctyl acrylate) copolymer.

11. An improved method of fabricating a micro-mechanical device, the method comprising:
    depositing at least one sacrificial layer on a substrate;
    curing the sacrificial layer;
    fabricating a micro-mechanical device on the first sacrificial layer;
    removing the first sacrificial layer;
    recoating the micro-mechanical device with a recoat layer of sufficient thickness to completely encapsulate the micro-mechanical device;
    curing the recoat layer; and
    removing the recoat layer by immersing the substrate in a cleansing solution comprising super-critical carbon dioxide and a solvent suitable to remove the sacrificial layer.

12. A method according to claim 11, wherein the solvent is selected from the group consisting of methanol, ethanol, ethyl acetate, methyl acetate, acetone, methylethylketone, and methyl tertiary-butyl ether.

13. A method according to claim 11, wherein the recoat layer comprises a mixture of novolac resin and a photoresist solvent.

14. A method according to claim 13, wherein the recoat layer does not contain a photoactive compound.

15. A method according to claim 11, wherein the step of curing the recoat layer comprises a hard bake.

16. A method according to claim 11, wherein the step of curing the recoat layer comprises a soft bake.

17. A method according to claim 11, wherein the step of curing the recoat layer comprises UV hardening.

18. A method according to claim 11, wherein the step of removing the recoat layer further comprises agitating the cleansing solution with an impeller.

19. A method according to claim 11, wherein the cleansing solution further comprises a non-ionic surfactant solution.

20. A method according to claim 19, wherein the non-ionic surfactant solution comprises a polystyrene-b-poly(1,1-dihydroperfluorooctyl acrylate) copolymer.

21. An improved method of fabricating a micro-mechanical device, the method comprising:
    depositing a first sacrificial layer on a substrate;
    removing portions of the first sacrificial layer to define a first set of vias;
    depositing a first metal layer on the first sacrificial layer;
    removing portions of the first metal layer to define a set of first via supports;
    depositing a second sacrificial layer on the first metal layer;
    removing portions of the second sacrificial layer to define a second set of vias;
    depositing a second metal layer on the second sacrificial layer;
    removing portions of the second metal layer to define a set of second vias; and
    removing the first and second sacrificial layers by immersing the substrate in a cleansing solution comprising super-critical carbon dioxide and a solvent suitable to remove the sacrificial layers.

22. A method according to claim 21, wherein the solvent is selected from the group consisting of methanol, ethanol, ethyl acetate, methyl acetate, acetone, methylethylketone, and methyl tertiary-butyl ether.

23. A method according to claim 21, wherein the first and second sacrificial layers comprise a photoresist solution.

24. A method according to claim 23, wherein the photoresist solution comprises a mixture of novolac resin and a photoresist solvent.

25. A method according to claim 21, wherein the step of removing the sacrificial layers further comprises agitating the cleansing solution with an impeller.

26. A method according to claim 21, wherein the cleansing solution further comprises a non-ionic surfactant solution.

27. A method according to claim 26, wherein the non-ionic surfactant solution comprises a polystyrene-b-poly(1,1-dihydroperfluorooctyl acrylate) copolymer.

28. An improved method of fabricating a micro-mechanical device, the method comprising:
    depositing a first sacrificial layer on a substrate;
    removing portions of the first sacrificial layer to define a first set of vias;
    depositing a first metal layer on the first sacrificial layer;
    removing portions of the first metal layer to define a set of first via supports;
    depositing a second sacrificial layer on the first metal layer;
    removing portions of the second sacrificial layer to define a second set of vias;
    depositing a second metal layer on the second sacrificial layer;
    removing portions of the second metal layer to define a set of second via supports;
    recoating the micro-mechanical device with a recoat layer of sufficient thickness to completely encapsulate the micro-mechanical device;
    curing the recoat layer; and
    removing the recoat layer by immersing the substrate in a cleansing solution comprising super-critical carbon dioxide and a solvent suitable to remove the recoat layer.

29. A method according to claim 28, wherein the solvent is selected from the group consisting of methanol, ethanol, ethyl acetate, methyl acetate, acetone, methylethylketone, and methyl tertiary-butyl ether.

30. A method according to claim 28, wherein the recoat layer comprises a mixture of novolac resin and a photoresist solvent.

31. A method according to claim 30, wherein the recoat layer does not contain a photoactive compound.

32. A method according to claim 28, wherein the step of curing the recoat layer comprises a hard bake.

33. A method according to claim 28, wherein the step of curing the recoat layer comprises a soft bake.

34. A method according to claim 28, wherein the step of curing the recoat layer comprises UV hardening.

35. A method according to claim 28, wherein the step of removing the recoat layer further comprises agitating the cleansing solution with an impeller.

36. A method according to claim 28, wherein the cleansing solution further comprises a non-ionic surfactant solution.

37. A method according to claim 36, wherein the non-ionic surfactant solution comprises a polystyrene-b-poly(1,1-dihydroperfluorooctyl acrylate) copolymer.

* * * * *